(12) United States Patent
Kako

(10) Patent No.: US 9,834,010 B2
(45) Date of Patent: Dec. 5, 2017

(54) PRINTER

(71) Applicant: Brother Kogyo Kabushiki Kaisha, Nagoya-shi, Aichi-ken (JP)

(72) Inventor: Keigo Kako, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 15/085,560

(22) Filed: Mar. 30, 2016

(65) Prior Publication Data

US 2016/0288557 A1 Oct. 6, 2016

(30) Foreign Application Priority Data

Mar. 30, 2015 (JP) ................................ 2015-070340

(51) Int. Cl.
 *B41J 3/46* (2006.01)
(52) U.S. Cl.
 CPC ...................................... *B41J 3/46* (2013.01)
(58) Field of Classification Search
 CPC ........................................................ B41J 3/46
 See application file for complete search history.

(56) References Cited

U.S. PATENT DOCUMENTS

2005/0066208 A1  3/2005 Koie et al.
2011/0199630 A1* 8/2011 Oozawa ................... B41J 3/01
                                                   358/1.14

FOREIGN PATENT DOCUMENTS

JP          2005-099960 A    4/2005

* cited by examiner

*Primary Examiner* — Alessandro Amari
*Assistant Examiner* — Roger W Pisha, II
(74) *Attorney, Agent, or Firm* — Banner & Witcoff, Ltd.

(57) ABSTRACT

The disclosure discloses a printer includes an error occurrence detecting portion, an interruption control portion, a switching portion, an error storage portion, and a display control portion. The error occurrence detecting portion detects occurrence of an error event. The interruption control portion interrupts a printing process. The switching portion performs switching to a supply shutoff state or a low power consumption state. The error storage portion stores contents of the error event corresponding to the interruption when the switching portion performs the switching. The display control portion controls the display device to display an error display screen representative of the contents of the error event stored in the error storage portion in the case that a return to a normal power supply state.

8 Claims, 10 Drawing Sheets

[FIG. 1]
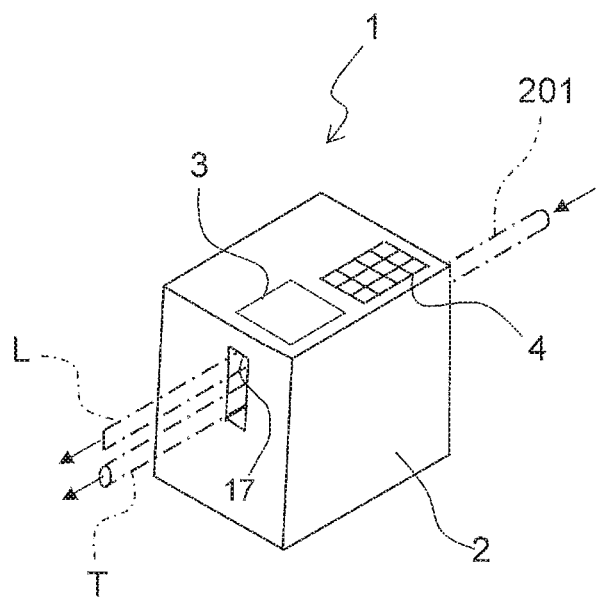

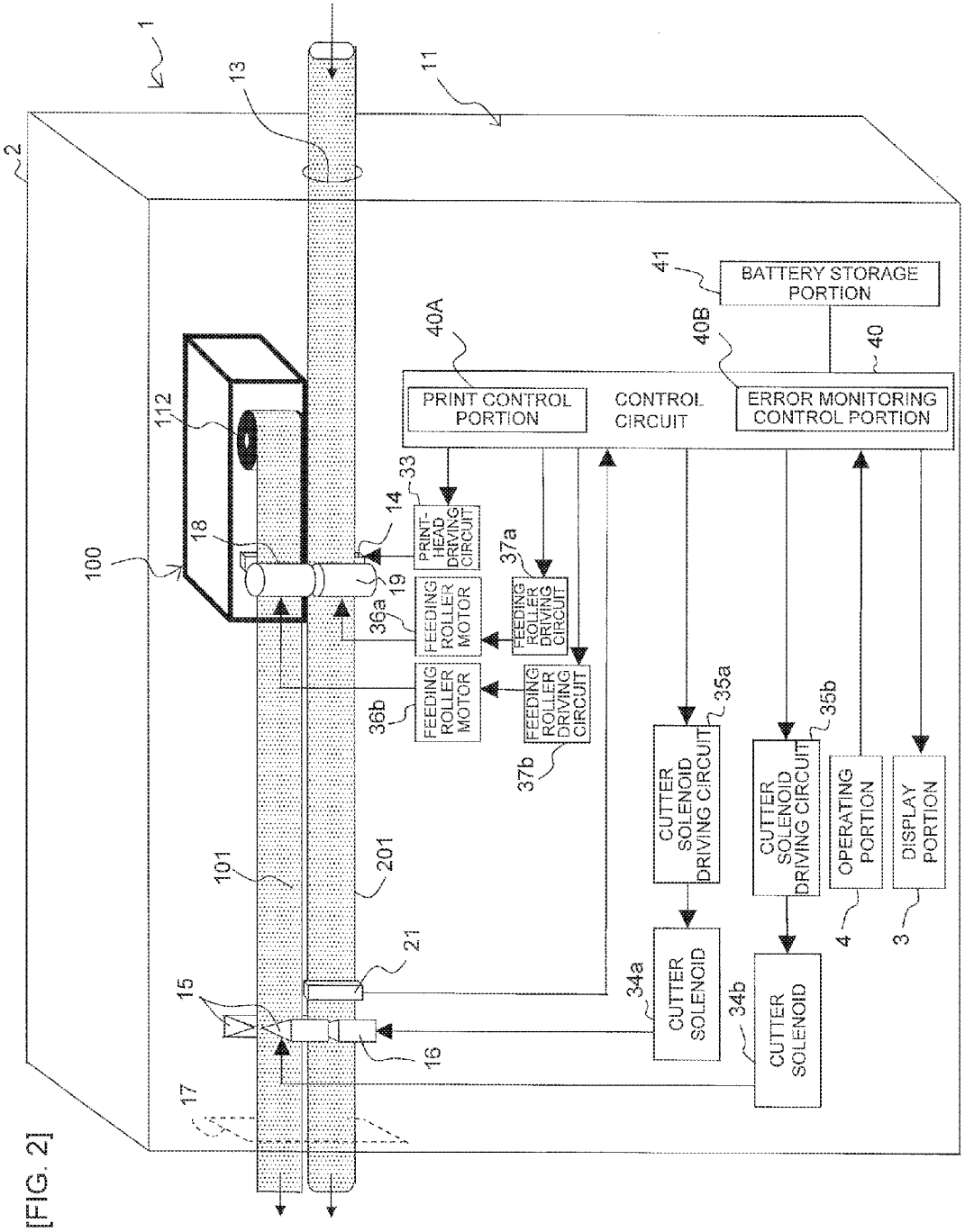
[FIG. 2]

[FIG. 3]
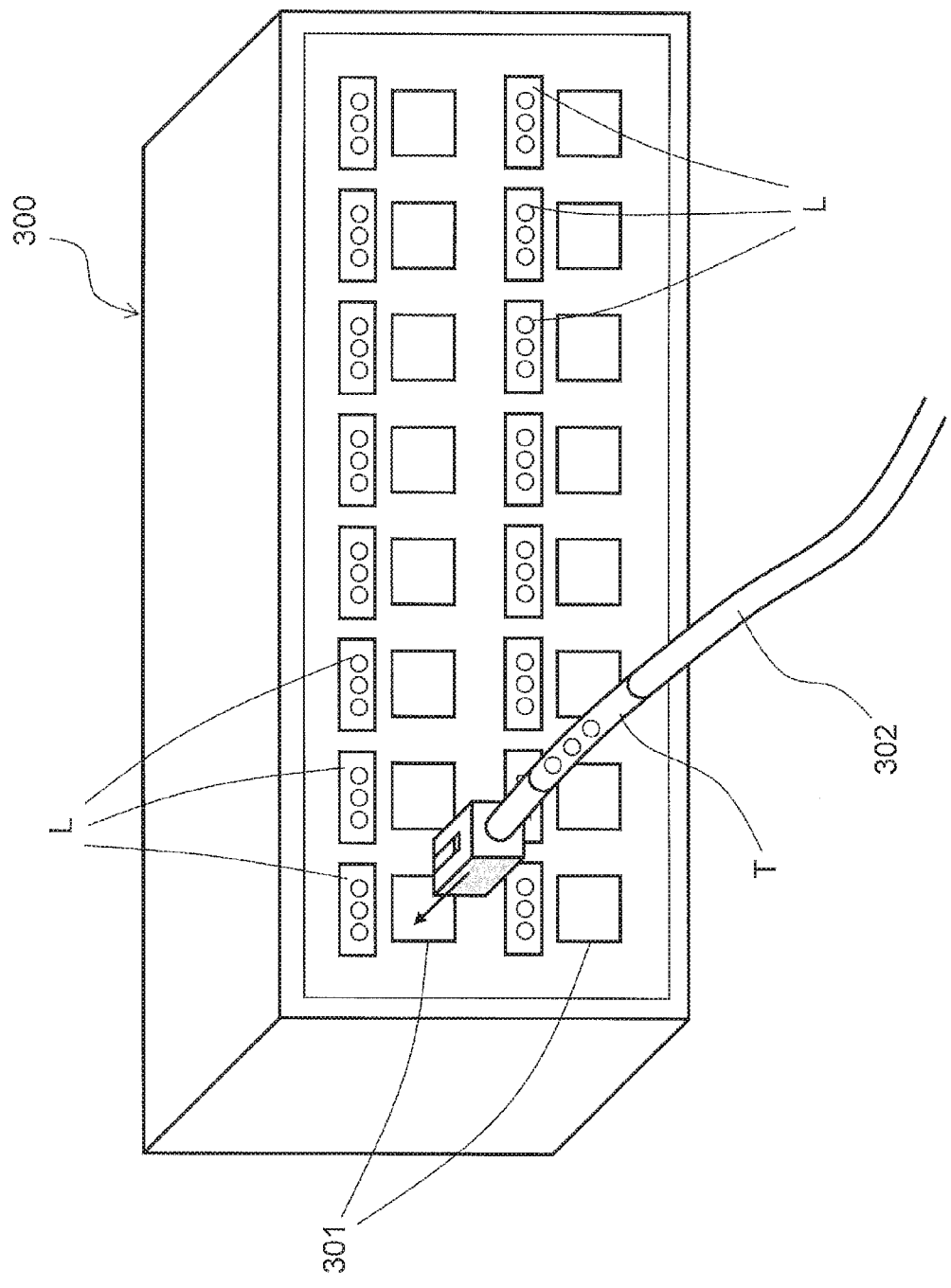

COMPARISON EXAMPLE

[FIG. 4A]
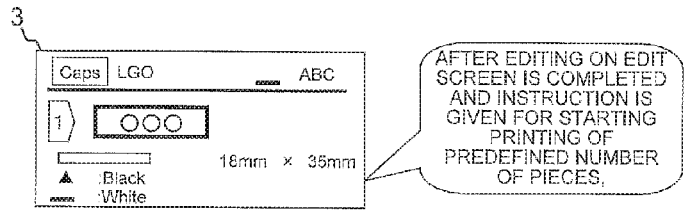
AFTER EDITING ON EDIT SCREEN IS COMPLETED AND INSTRUCTION IS GIVEN FOR STARTING PRINTING OF PREDEFINED NUMBER OF PIECES.

[FIG. 4B]
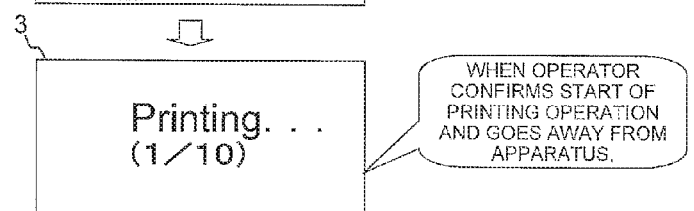
WHEN OPERATOR CONFIRMS START OF PRINTING OPERATION AND GOES AWAY FROM APPARATUS.

[FIG. 4C]
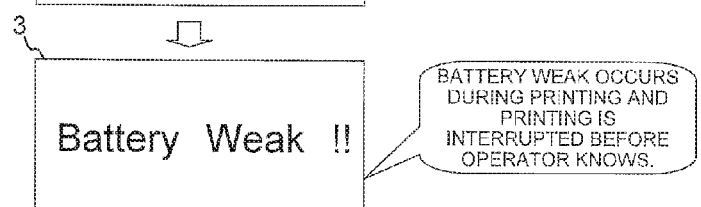
BATTERY WEAK OCCURS DURING PRINTING AND PRINTING IS INTERRUPTED BEFORE OPERATOR KNOWS.

[FIG. 4D]
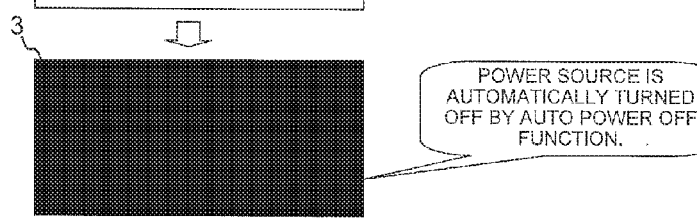
POWER SOURCE IS AUTOMATICALLY TURNED OFF BY AUTO POWER OFF FUNCTION.

[FIG. 4E]
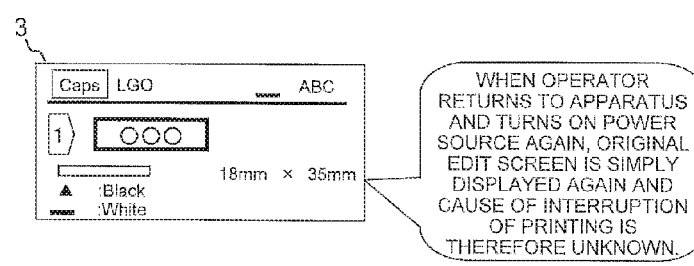
WHEN OPERATOR RETURNS TO APPARATUS AND TURNS ON POWER SOURCE AGAIN, ORIGINAL EDIT SCREEN IS SIMPLY DISPLAYED AGAIN AND CAUSE OF INTERRUPTION OF PRINTING IS THEREFORE UNKNOWN.

EMBODIMENT
[FIG. 5A]
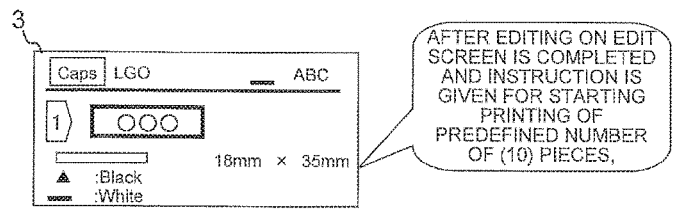
[FIG. 5B]
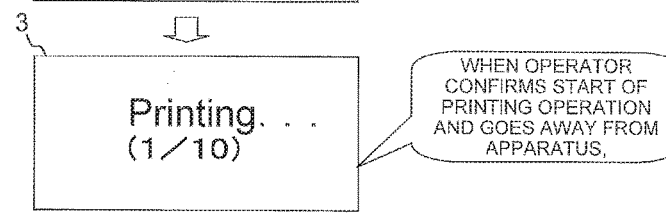
[FIG. 5C]
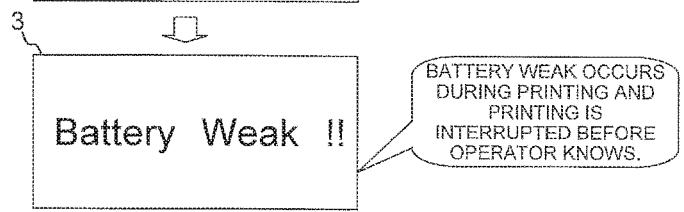
[FIG. 5D]
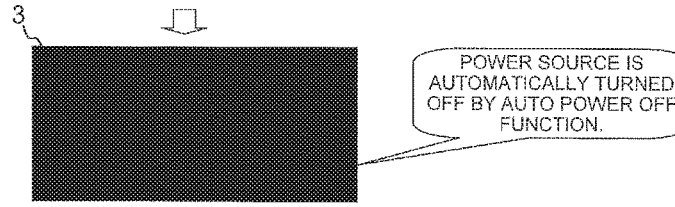
[FIG. 5E]
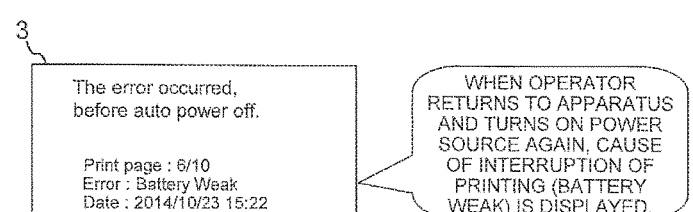
[FIG. 5F]
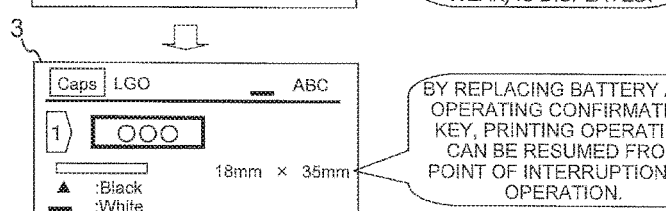

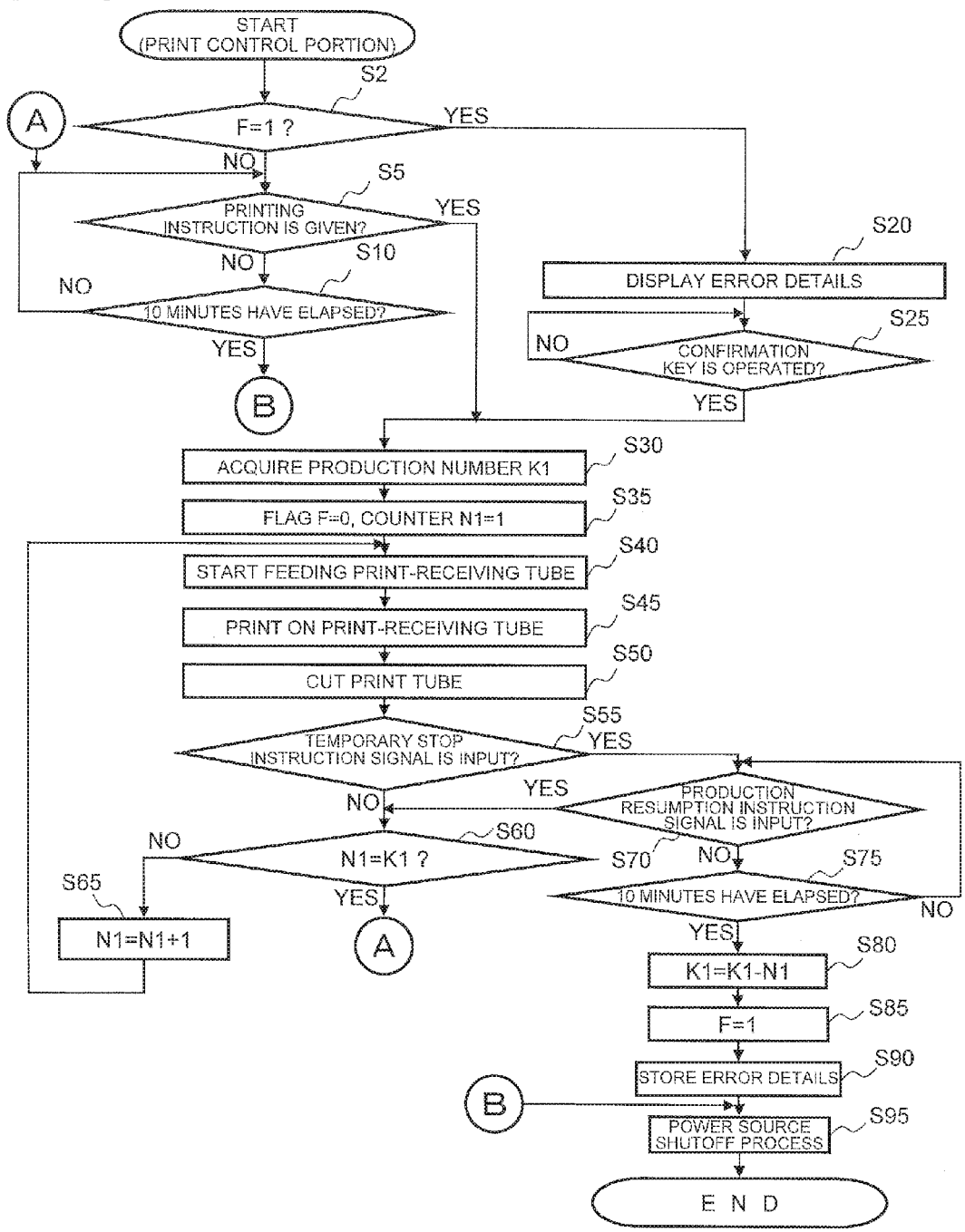
[FIG. 6]

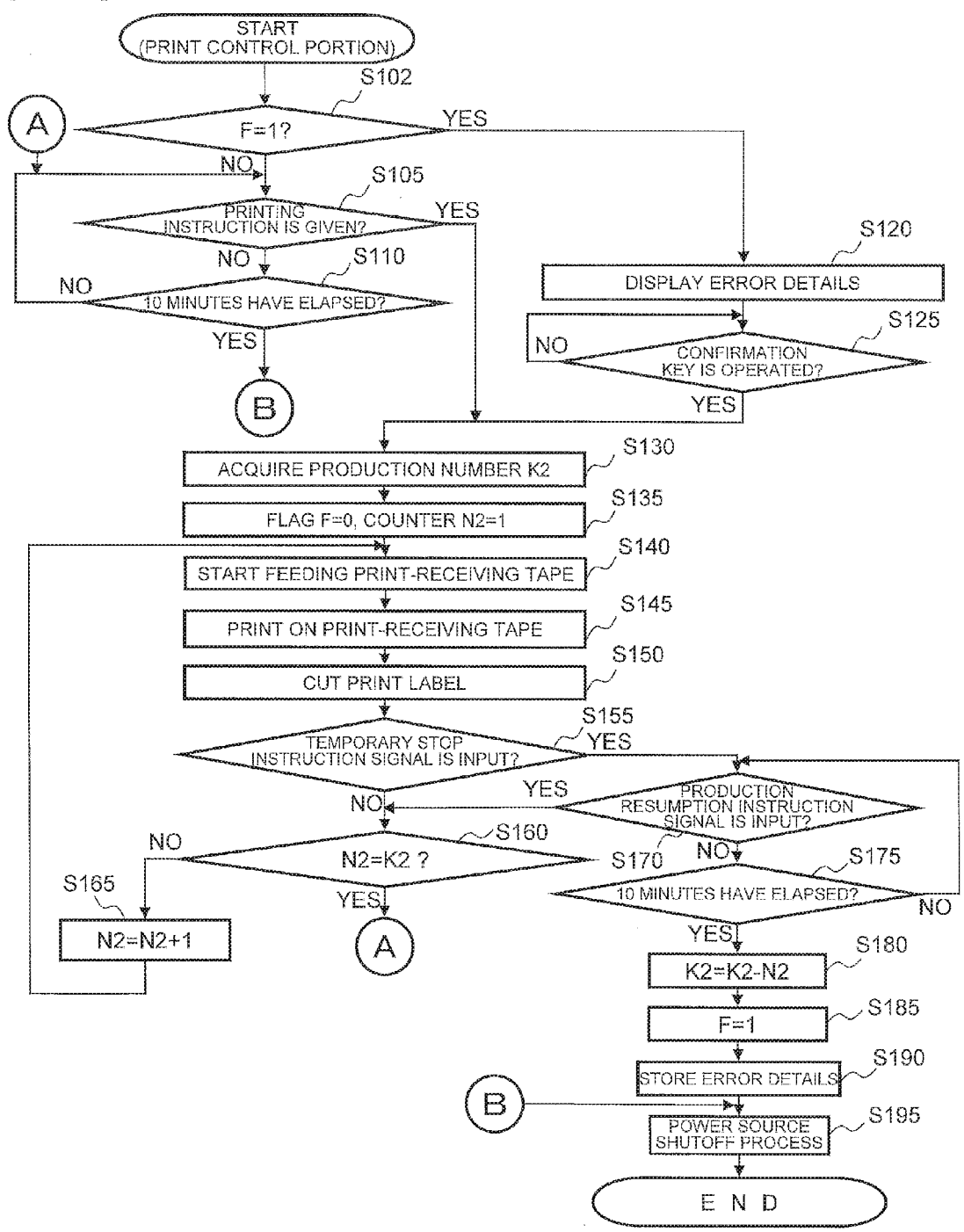
[FIG. 7]

[FIG. 8]
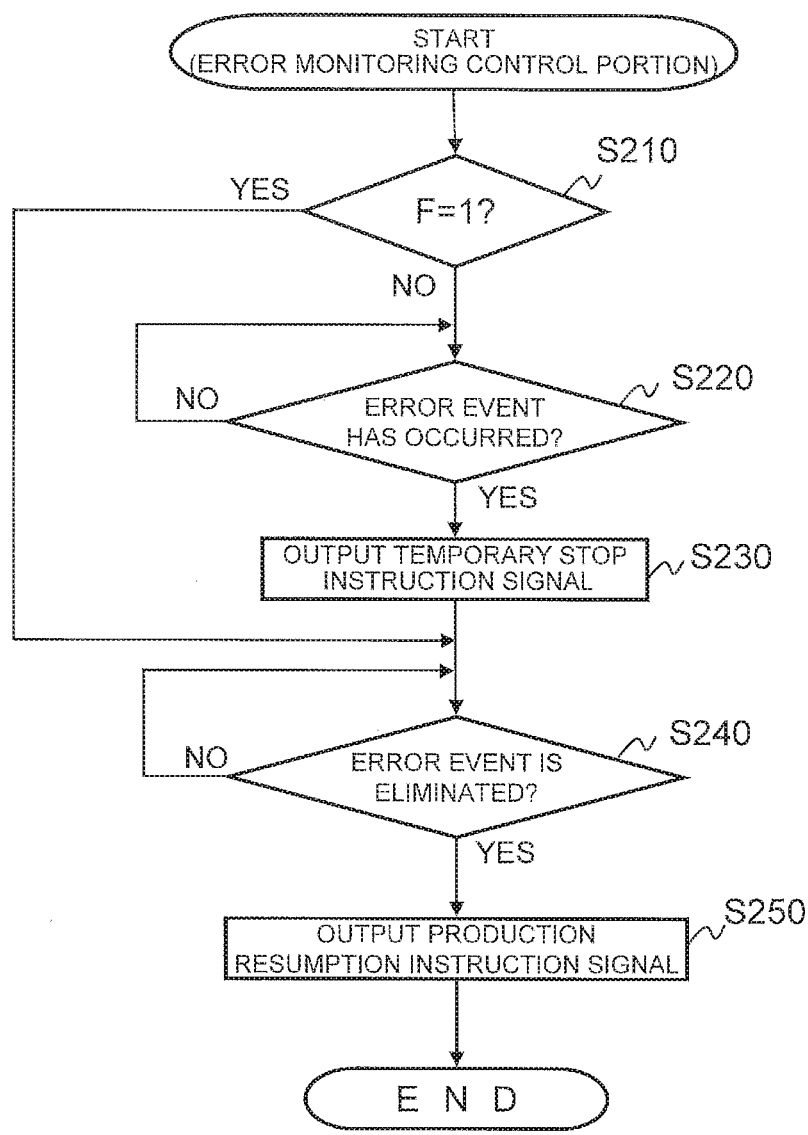

[FIG. 9A]

The error occurred,
before auto power off.

Print :Label
Print page : 6/10
Error : Battery Weak
Date : 2014/10/23 15:22

[FIG. 9B]

The error occurred,
before auto power off.

Print :Tubel
Print page : 6/10
Error : Battery Weak
Date : 2014/10/23 15:22

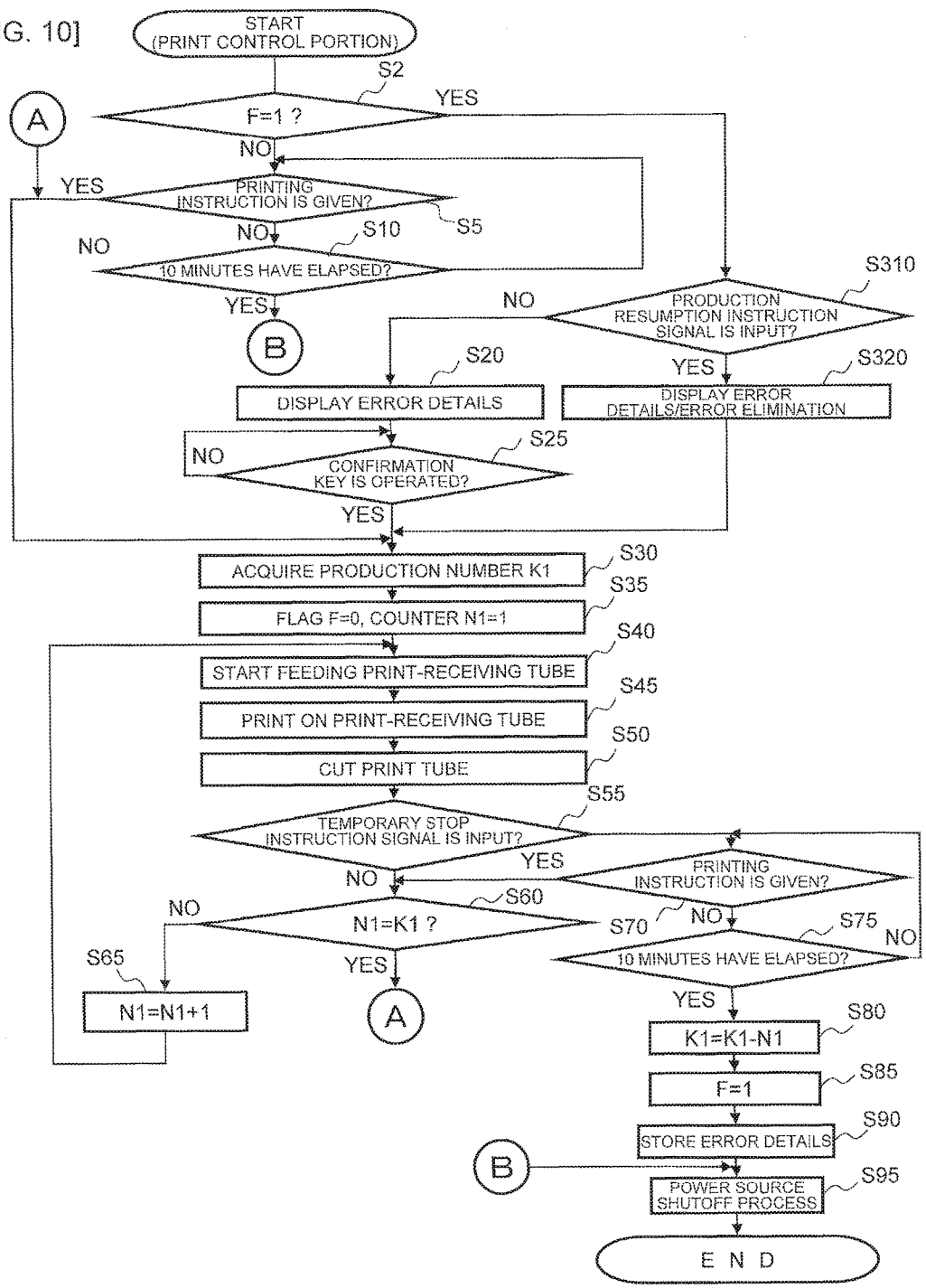

PRINTER

CROSS-REFERENCE TO RELATED APPLICATION

The present application claims priority from Japanese Patent Application No. 2015-70340, which was filed on Mar. 30, 2015, the disclosure of which is incorporated herein by reference in its entirety.

BACKGROUND

Field

The preset disclosure relates to a printer performing desired printing on a print-receiving medium.

Description of the Related Art

A printer is known that performs desired printing on a print-receiving medium and that has a so-called auto power-off function. In the prior art, when a predetermined reference time has elapsed in an operation stop state, the printer is switched to a supply shutoff state of power source voltage so as to save energy (=auto power-off).

In general, if a printer of this type has some sort of error event (e.g., insufficient voltage of a battery or overheating of a printing head) occurring in association with the operation mechanisms during a printing process, the printing process is interrupted. Therefore, for example, in such a case that an operator goes away from the vicinity of the printer to another place after a printing process is started, the operations of all the operation mechanisms are stopped due to the interruption for a relatively long time. As a result, if the auto power-off function as in the prior art is equipped, the operator coming back to the vicinity of the printer performs a return operation for returning to a normal power supply state (because the printer is in the supply shutoff state of the power source voltage); however, since the operator dose not notice the occurrence of the error event causing the auto power-off in this case, the error event may occur again when the printing process is resumed after the returning.

The same problem exists also if the operation stop state is switched to a low power consumption state (so-called sleep) instead of the supply shutoff state of the power source voltage (auto power-off) when a predetermined reference time has elapsed.

SUMMARY

It is an object of the present disclosure to provide a configuration capable of preventing an error event from occurring repeatedly in a printer having an auto power-off or sleep function.

In order to achieve the above-described object, according to the aspect of the present application, there is provided a printer comprising a plurality of operation mechanisms that includes a feeder configured to feed a print-receiving medium, a printing head configured to form a desired print on the print-receiving medium, and a display device configured to perform desired display, and is configured to be operated by a supplied power source voltage, an accepting portion configured to accept a printing instruction, and an operation control portion configured to control the plurality of operation mechanisms in accordance with the printing instruction accepted by the accepting portion so as to sequentially execute a printing process onto a predefined amount of the print-receiving medium, an error occurrence detecting portion configured to detect occurrence of an error event related to an operation of at least one of the plurality of operation mechanisms, an interruption control portion configured to interrupt a printing process onto the predefined amount of the print-receiving medium corresponding to the printing instruction in the case that the error occurrence detecting portion detects occurrence of the error event during the printing process, a switching portion configured to perform switching to a supply shutoff state or a low power consumption state of the power source voltage, the switching being triggered by an elapse of a reference time after the interruption control portion interrupts the printing process, an error storage portion configured to store contents of the error event corresponding to the interruption when the switching portion performs the switching to the supply shutoff state or the low power consumption state, and a display control portion configured to control the display device to display an error display screen representative of the contents of the error event stored in the error storage portion in the case that a return to a normal power supply state is made by a return operation after the switching by the switching portion.

BRIEF DESCRIPTION OF THE DRAWINGS

FIG. 1 is a perspective view of a general exterior configuration of a printer of an embodiment of the present disclosure.

FIG. 2 is a conceptual configuration diagram of an internal configuration of the printer.

FIG. 3 is a view of examples of use of print labels and a print tube produced by the printer.

FIG. 4A is an explanatory view of a transition of display on a display portion in a comparison example for the embodiment of the present disclosure.

FIG. 4B is an explanatory view of a transition of display on the display portion in the comparison example for the embodiment of the present disclosure.

FIG. 4C is an explanatory view of a transition of display on the display portion in the comparison example for the embodiment of the present disclosure.

FIG. 4D is an explanatory view of a transition of display on the display portion in the comparison example for the embodiment of the present disclosure.

FIG. 4E is an explanatory view of a transition of display on the display portion in the comparison example for the embodiment of the present disclosure.

FIG. 5A is an explanatory view of a transition of display on the display portion in the embodiment of the present disclosure.

FIG. 5B is an explanatory view of a transition of display on the display portion in the embodiment of the present disclosure.

FIG. 5C is an explanatory view of a transition of display on the display portion in the embodiment of the present disclosure.

FIG. 5D is an explanatory view of a transition of display on the display portion in the embodiment of the present disclosure.

FIG. 5E is an explanatory view of a transition of display on the display portion in the embodiment of the present disclosure.

FIG. 5F is an explanatory view of a transition of display on the display portion in the embodiment of the present disclosure.

FIG. 6 is a flowchart of a tube printing control procedure executed by a print control portion.

FIG. 7 is a flowchart of a label printing control procedure executed by the print control portion.

FIG. 8 is a flowchart of a control procedure executed by an error monitoring control portion.

FIG. 9A is an explanatory view of a display example on the display portion in a modification example of clearly indicating whether a print label is being produced or a print tube is being produced.

FIG. 9B is an explanatory view of a display example on the display portion in the modification example of clearly indicating whether a print label is being produced or a print tube is being produced.

FIG. 10 is a flowchart of a control procedure executed by the print control portion in a modification example corresponding to the case that an error event is eliminated before a power source is turned on again.

DETAILED DESCRIPTION OF THE PREFERRED EMBODIMENTS

An embodiment of the present disclosure will now be described with reference to the drawings.

Configuration of Tube/Tape Printing Apparatus

FIG. 1 shows a general exterior configuration of a printer 1 (corresponding to a print label/print tube producing apparatus, a print label producing apparatus, and a printer) of this embodiment. FIG. 2 is a conceptual configuration diagram of an internal configuration of the printer 1. In FIGS. 1 and 2, a housing 2 making up an outer contour of an apparatus main body 11 of the printer 1 is disposed with a cartridge holder portion (not shown) as a recess. To this cartridge holder portion, a cartridge 100 is detachably attached that is capable of supplying a print-receiving tape 101 (corresponding to a print-receiving medium) for producing a print label L. A rear surface of the housing 2 (a surface on the right back side of FIG. 1, a surface on the right side of FIG. 2) has a tube insertion hole 13 formed for allowing an operator, i.e., a user, to insert a print-receiving tube 201 (corresponding to a print-receiving medium) for producing a print tube T from the outside of the housing 2. The printer 1 includes a plurality of operation mechanisms forming respective desired prints on the print-receiving tape 101 and the print-receiving tube 201.

An upper surface of the housing 2 (a surface on the upper side of FIG. 1) is disposed with a display portion 3 (corresponding to a display device) and an operating portion 4. As a result, while checking various screens etc. displayed on the display portion 3, the operator can cause the printer 1 to execute a desired process including production of the print label L or the print tube T, through an operation to the operating portion 4.

The apparatus main body 11 has the housing 2, a printing head 14, a tape cutter 15, a tube cutter 16, a tape feeding roller 18, a tube feeding roller 19, and a sensor 21.

The housing 2 includes the cartridge holder portion to which the cartridge 100 is fitted and the tube insertion hole 13, and is disposed with the display portion 3 and the operating portion 4.

The tape feeding roller 18 (corresponding to a feeder) feeds along a tape feeding path the print-receiving tape 101 (corresponding to a print-receiving medium) supplied from a tape roll 112 included in the cartridge 100. The tube feeding roller 19 (corresponding to a feeder) feeds along a tube feeding path the print-receiving tube 201 (corresponding to a print-receiving medium) inserted from the tube insertion hole 13. The tube feeding roller 19 is located at substantially the same feeding direction position as the tape feeding roller 18.

The printing head 14 is disposed commonly across the tape feeding path of the print-receiving tape 101 and the tube feeding path of the print-receiving tube 201. The tape feeding roller 18 and the tube feeding roller 19 are arranged to face the printing head 14. This printing head 14 can form respective desired prints on the print-receiving tape 101 and the print-receiving tube 201 fed by the tape feeding roller 18 and the tube feeding roller 19.

The tape cutter 15 cuts the print-receiving tape 101 after print formation into a desired length to produce the print label L in a label shape. The tube cutter 16 cuts the print-receiving tube 201 after print formation into a desired length to produce the print tube T in a short tube shape. The tube cutter 16 is located at substantially the same feeding direction position as the tape cutter 15.

Although not particularly shown, a guide roller, a carry-out roller, etc. not shown other than the tape feeding roller 18 and the tube feeding roller 19 may be disposed on the label feeding path and the tube feeding path at suitable positions for the convenience of feeding of the print-receiving tape 101 and the print-receiving tube 201 and discharging from the housing 2.

The sensor 21 in this example is positioned near and upstream of the tube cutter 16 along the feeding path of the print-receiving tube 201. The sensor 21 detects the presence of the print-receiving tube 201 with a known technique of optical detection, magnetic detection, etc., and inputs a corresponding detection signal to a control circuit 40 (described later). The position of disposition of the sensor 21 is not limited to this example and may be at another position on the tube feeding path (e.g., near the tube insertion hole 13 or near and upstream of the printing head 14).

Although not particularly shown, a temperature sensor is disposed for detecting a temperature of the printing head 14. If this temperature sensor detects a temperature of the printing head 14 equal to or greater than a predefined threshold value, it is considered that overheating of the printing head 14 defined as an error event has occurred, and a cooling process is executed with a known technique.

On the other hand, the apparatus main body 11 also has a print-head driving circuit 33 controlling energization of heat generation elements (not shown) included in the printing head 14, cutter solenoids 34a, 34b, cutter solenoid driving circuits 35a, 35b, feeding roller motors 36a, 36b, feeding roller driving circuits 37a, 37b, the control circuit 40, and a battery storage portion 41. The display portion 3 and the operating portion 4 are connected to the control circuit 40.

The cutter solenoid 34a drives the tube cutter 16 to perform the cutting operation. The cutter solenoid 34b drives the tape cutter 15 to perform the cutting operation. The cutter solenoid driving circuits 35a, 35b respectively control the cutter solenoids 34a, 34b.

The feeding roller motor 36a drives the tube feeding roller 19. The feeding roller motor 36b drives the tape feeding roller 18. The feeding roller driving circuits 37a, 37b respectively control the feeding roller motors 36a, 36b.

The control circuit 40 controls the whole of the printer 1 through the print-head driving circuit 33, the cutter solenoid driving circuits 35a, 35b, the feeding roller driving circuits 37a, 37b, etc. The control circuit 40 is a so-called microcomputer, includes a CPU, i.e., a central processing unit, a flash memory, and a RAM although not shown in detail, and executes a signal process in accordance with a program stored in the flash memory in advance while using a temporary storage function of the RAM. As a result, various screens etc. are displayed on the display portion 4 and the print label L or the print tube T is produced in accordance with operations to the operating portion 4.

The battery storage portion 41 stores a battery (not shown) acting as a power source and supplies electric power to the portions including the control circuit 40. The control circuit 40 monitors a voltage of the battery stored in the battery storage portion 41 and executes a necessary process in accordance with a result of the monitoring (described later in detail).

The control circuit 40 functionally includes a print control portion 40A and an error monitoring control portion 40B. Functions of these portions will be described later in detail.

General Operation of Producing Print Label

When the cartridge 100 is mounted on a cartridge holder in the printer 1 having the above configuration, the print-receiving tape 101 fed out from the cartridge 100 is interposed between the tape feeding roller 18 and the printing head 14. The tape feeding roller 18 is rotated by a drive force of the feeding roller motor 36b, and the print-receiving tape 101 is fed through between the tape feeding roller 18 and the printing head 14. In this state, a plurality of heat generation elements (not shown) disposed on the printing head 14 are energized to generate heat in accordance with the control of the print-head driving circuit 33 performed by the print control portion 40A of the control circuit 40. As a result, a print of desired print contents is printed by the printing head 14 on the print-receiving tape 101. Subsequently, the tape cutter 15 is operated by energization of the cutter solenoid 34b so as to cut the print-receiving tape 101 after completion of the print formation, and the print label L is produced and discharged from a discharge port 17 to the outside of the housing 2.

For example, the back side of a print surface of the print-receiving tape 101 is disposed with an adhesive layer (not shown) made of a suitable adhesive, for example, and the print label L is affixed to a surface of a predefined target object with the print surface facing outside.

General Operation of Producing Print Tube

On the other hand, when the print-receiving tube 201 is inserted from the outside of the housing 2 via the tube insertion hole 13 in the printer 1 having the above configuration, the print-receiving tube 201 is interposed between the tube feeding roller 19 and the printing head 14. The tube feeding roller 19 is rotated by a drive force of the feeding roller motor 36a, and the print-receiving tube 201 is fed through between the tube feeding roller 19 and the printing head 14. In this state, the plurality of heat generation elements (not shown) disposed on the printing head 14 are energized by the print control portion 40A of the control circuit 40 to generate heat. As a result, a print of desired print contents is printed by the printing head 14 on the print-receiving tube 201. Subsequently, the tube cutter 16 is operated by energization of the cutter solenoid 34a so as to cut the print-receiving tube 201 after completion of the print formation, and the print tube T is produced and discharged from the discharge port 17 to the outside of the housing 2.

For example, the print-receiving tube 201 is made of an elastic material having a heat-shrinkable property. While a cable thinner than the inner diameter thereof is inserted, the produced print tube T is entirely heated and thereby fixed to the outer circumference of the cable (see FIG. 3 described later).

In the above description, the tape feeding roller 18 acting as a feeder, the printing head 14, the display portion 3 acting as a display device, the tape cutter 15, the tube cutter 16, etc., correspond to operation mechanisms described in claims.

Examples of Use of Print Label and Print Tube

FIG. 3 shows examples of use of the print label L and the print tube T produced by the printer 1. In FIG. 3, for example, a switching hub 300 relaying information on a wired LAN network has eight slots 301 on each of upper and lower rows (16 slots in total).

The slots 301 must be connected respectively to properly corresponding cables 302. Therefore, in this example, the print labels L having respective identification names (not shown) printed thereon are affixed near and above the slots 301. On the other hand, the cables 302 to be inserted respectively to the slots 301 are equipped with the print tubes T on which the identification names (not shown) of the respective slots 301 to be connected are printed. Thus, the print label L and the print tube T having the text of the same identification name printed thereon are assigned to a set of the slot 301 and the cable 302 corresponding to each other. As a result, the corresponding relations of the slots 301 and the cables 302 to be connected are clarified, so that miswiring can be prevented.

Characteristic of Embodiment

When a predetermined reference time has elapsed in an operation stop state, the printer 1 of this embodiment is switched to a supply shutoff state of power source voltage so as to save energy (so-called auto power-off function. see, e.g., step S95 of FIG. 6 and step S195 of FIG. 7 described later). The operator can perform a suitable return operation to the printer in this supply shutoff state of power source voltage to return the printer to a power supply state. A characteristic of this embodiment is in display contents on the display portion 3 at the time of returning to the power supply state in this way. Details thereof will hereinafter be described with reference to a comparison example in order.

Comparison Example

For example, as shown in FIG. 4A, when an operator performs editing for printing desired print contents with an edit screen displayed on the display portion 3 and gives an instruction for starting printing of the desired number of pieces (FIG. 4A), the printing is started (FIG. 4B).

After confirming the start of the printing, for example, the operator may go away from the vicinity of the printer 1 to another place in some cases. During the absence of the operator, some sort of error event (in this example, a battery weak of the battery in the battery storage portion) may occur in the printer 1, causing interruption of the printing operation (FIG. 4C). In such a case, because of the absence of the operator, the power source is automatically turned off after a while by the auto power-off function described above (FIG. 4D).

Subsequently, since the apparatus is in the power-off state when the operator comes back to the vicinity of the printer 1 from the remote place, the operator performs the return operation for turning on the power source again. However, when the power source is turned on again, typically, the original edit screen is simply displayed again, and the operator does not know why the auto power-off is performed (i.e., what is the error event) (FIG. 4E). Therefore, the operator is unable to immediately recognize the occurrence of the error event during the printing.

Technique of Embodiment

FIGS. 5A to 5E show a technique of the embodiment for eliminating the above situation. In this embodiment, as is the case with FIGS. 4A to 4D, when the operator edits the print contents, gives an instruction for starting printing (FIG. 5A), and goes away after the start of the printing (FIG. 5B), an error event (the battery weak as in the above example) occurs in the absence of the operator (FIG. 5C) and the power source is automatically turned off after a predefined time has elapsed (FIG. 5D). However, contents of the occurring error event are stored at the time of turning off of the power source and, when the operator subsequently turns on the power source again as is the case with the above description, an error display screen is displayed to display a message representative of the presence of the occurrence of the error event and the contents of the occurring error event (the battery weak) stored as described above (FIG. 5E). In a display example of FIG. 5E, the screen displays that the error event has occurred before the power source is automatically turned off, that the occurring error event is a battery weak, and that the operation is stopped when six out of ten print labels L are completely printed in a print job in this situation, along with the date and time of occurrence of the error event etc. It is noted that the printing contents (such as text characters and graphics resulting from the editing by the operator) may be displayed together.

From the display of such a message, the operator can immediately recognize the contents of the occurring error event (the battery weak in the above example) and therefore can immediately dealt with the occurring error event. In the case of the above example, the operator can replace the battery store in the battery storage portion 41 and perform a suitable operation (e.g., push a confirmation key included in the operating portion 4), so as to resume the production of the remaining (in the above example, four) print labels L from the point of interrupted (FIG. 5F). This improves the convenience and makes the work more efficient for the operator.

Details of Control Carried Out by Print Control Portion

A control procedure executed by the print control portion 40A of the control circuit 40 of the printer 1 for implementing the technique will be described with reference to FIGS. 6 and 7. Since the printer 1 can selectively produce the print label L or the print tube T as described above, FIG. 6 shows the control procedure for performing the technique during production of the print tube T and FIG. 7 shows the control procedure for performing the technique during production of the print label L.

During Production of Print Tube

In FIG. 6, it is assumed that before this flow is started, an operator completes an editing operation with an edit screen displayed on the display portion 3 as described above. First, at step S2, the print control portion 40A determines whether a value of a flag F is one. The flag F indicates whether the auto power-off function is performed, and has F=1 if the auto power-off is already performed once or F=0 if the auto power-off is not yet performed (see step S85 described later). In the case of F=0 when the auto power-off is not yet performed, the determination is negative (S2:NO) and the print control portion 40A goes to step S5.

At step S5, the print control portion 40A determines whether a printing instruction is given through the operating portion 4 from the operator. If no printing operation is given (S5:NO), the print control portion 40A goes to step S10. The print control portion 40A executing step S5 acts as an accepting portion described in claims.

At step S10, the print control portion 40A determines whether a predefined reference time (in this example, 10 minutes. the same hereinafter) set for automatically turning off the power source has elapsed without the printing instruction (i.e., without starting a printing operation after the edit operation).

If 10 minutes have not elapsed, the determination is negative (S10:NO) and the print control portion 40A returns to step S5 to repeat the same procedure. During this repetition, if the printing instruction is given, the determination of step S5 becomes affirmative (S5:YES) and the print control portion 40A goes to step S30. If 10 minutes have elapsed during the repetition, the determination of step S10 becomes affirmative (S10:YES) and the print control portion 40A goes to step S95 described later.

At step S30, the print control portion 40A acquires the production number K1 of the print tubes T specified by the operator in the edit operation.

Subsequently, going to step S35, the print control portion 40A resets the value of the flag F to zero and sets a counter variable N1 corresponding to the number of printing processes to one.

Going to step S40, the print control portion 40A starts feeding the print-receiving tube 201. Specifically, the print control portion 40A outputs a command signal instructing the feeding roller driving circuit 37a to start driving so as to rotate the tube feeding roller 19 via the feeding roller motor 36a. As a result, the feeding of the print-receiving tube 201 inserted by the operator through the tube insertion hole 13 is started.

Subsequently, going to step S45, the print control portion 40A controls the printing head 14 via the print-head driving circuit 33 to form a print corresponding to print data of the edit operation contents on the print-receiving tube 201.

Subsequently, going to step S50, the print control portion 40A cuts the print-receiving tube 201 after the print formation of step S45. Specifically, the print control portion 40A outputs a command signal instructing the feeding roller driving circuit 37a to stop driving so as to stop the tube feeding roller 19 rotated by the feeding roller motor 36a. Subsequently, the print control portion 40A outputs a command signal to the cutter solenoid driving circuit 35a. As a result, the tube cutter 16 is operated by a drive force of the cutter solenoid 34a and a print portion of the print-receiving tube 201 is separated as the print tube T. As a result, the print tube T can be discharged from the discharge port. The print tube T may be discharged by the carry-out roller described above.

Going to step S55, the print control portion 40A determines whether a temporary stop instruction signal is input. This temporary stop instruction signal is a signal for the error monitoring control portion 40B detecting an error event and notifying the print control portion 40A of the occurrence of the error event (see step S230 of FIG. 8). Therefore, if an error event has not yet occurred, the determination is negative (S55:NO) and the print control portion 40A goes to step S60.

At step S60, the print control portion 40A determines whether the value of the counter variable N1 at this time point is the same as the production number K1. In other words, the print control portion 40A determines whether the production of the print tubes T is completed by the production number K1. If the value of the counter variable N1 is different from the production number K1, the determination is negative (S60:NO) and the print control portion 40A goes to step S6.

At step S65, the print control portion 40A adds one to the value of the counter variable N1 and then returns to step S40 to repeat the same procedure.

If steps S40, S45, S50, S55, S60, S65, S40, etc. are repeated as described above without occurrence of an error event and the value of the counter variable N1 becomes the same as the production number K1 (in other words, the production of the print tubes T is completed by the production number K1), the determination of step S60 becomes affirmative (S60:YES) and the print control portion 40A returns to step S5. As a result, the print control portion 40A enters a state of waiting for an instruction for the next print tube T production job from the operator.

In the above description, the print control portion 40A executing steps S30 to S50, S60, and S65 acts as an operation control portion described in claims.

On the other hand, if some sort of error even occurs during repetition of steps S40, S45, S50, S55, S60, S65, S40, etc. as described above and the temporary stop instruction signal is input from the error monitoring control portion 40B, the determination of step S55 becomes affirmative (S55:YES) and the print control portion 40A goes to step S70.

At step S70, the print control portion 40A determines whether a production resumption instruction signal is input. This production resumption instruction signal is a signal output by the error monitoring control portion 40B for notifying the print control portion 40A of elimination of the error event.

If the error event is not eliminated and the production resumption instruction signal is not input, the determination is negative (S70:NO) and the print control portion 40A goes to step S75. At step S75, the print control portion 40A determines whether the reference time (10 minutes) has elapsed without input of the production resumption instruction signal (i.e., without elimination of the error event).

If 10 minutes have not elapsed, the determination is negative (S75:NO) and the print control portion 40A returns to step S70 to repeat the same procedure. If the error event described above is eliminated (by an operator's suitable process as described later) during this repetition, the determination of step S70 becomes affirmative (S70:YES) and the print control portion 40A goes to step S60 described above.

If 10 minutes have elapsed during the repetition, the determination of step S75 becomes affirmative (S75:YES) and the print control portion 40A goes to step S80.

At step S80, the print control portion 40A updates the value of the production number K1 to a value acquired by subtracting the value of the counter variable N1 at this time point (=K1−N1).

Subsequently, at step S85, the print control portion 40A sets the flag F=1 and then goes to step S90. At step S90, the print control portion 40A stores contents of the error event occurring (and not yet eliminated) at this time point as described above. The information representative of the contents of the error event may be input, for example, at the time of input of the temporary stop instruction signal of step S55, along with this signal from the error monitoring control portion 40B. Alternatively, the print control portion 40A may output a storage instruction signal and the error monitoring control portion 40B receiving this signal may store the contents of the error event. The contents to be stored include, for example, information indicative of the type of the occurring error event, the time of occurrence of the error event, the value of the production number K1 at this time point, etc.

Type of Error Event

In this embodiment, the following five types are assumed as the error event monitored by the error monitoring control portion 40B in terms of occurrence.
(i) Battery Weak This is a state of the output voltage of the battery stored in the battery storage portion 41 decreasing to a level at which battery replacement is required in a short time as described above as an example of the error event. To detect this state, this embodiment includes a predefined battery weak voltage set and stored in advance as a threshold value. If it is detected that the value of the output voltage drops to the battery weak voltage or less, this is considered as the occurrence of the battery weak defined as the error event, and the error monitoring control portion 40B outputs the temporary stop instruction signal to the print control portion 40A (see step S230 of FIG. 9 described later. the same hereinafter). If it is subsequently detected that the output voltage becomes higher than the battery weak voltage because of battery replacement etc., the error monitoring control portion 40B outputs the production resumption instruction signal to the print control portion 40A (see step S250 of FIG. 9 described later. the same hereinafter).
(ii) Battery Empty This is a state of the output voltage of the battery stored in the battery storage portion 41 decreasing to a level at which the apparatus is no longer able to operate. To detect this state, this embodiment includes a predefined battery empty voltage set and stored in advance as a threshold value. If it is detected that the value of the output voltage drops to the battery empty voltage or less, this is considered as the occurrence of the battery empty defined as the error event, and the error monitoring control portion 40B outputs the temporary stop instruction signal to the print control portion 40A. If it is subsequently detected that the output voltage becomes higher than the battery empty voltage because of battery replacement etc., the error monitoring control portion 40B outputs the production resumption instruction signal to the print control portion 40A.
(iii) Inability to Supply or Failure in Feeding of Print-Receiving Tube (or Print-Receiving Tape)

This is a state in which the print-receiving tube 201 (or the print-receiving tape 101) is not available (or a feeding disorder such as jamming occurs) on the feeding path. For the print-receiving tube 201, the determination is made by the error monitoring control portion 40B based on a detection signal from the sensor 21. For the print-receiving tape 101, a tape sensor (not shown) is separately disposed for detecting running out of the tape (or occurrence of feeding disorder such as tape jamming) in the cartridge 100, and the determination is made by the error monitoring control portion 40B based on a detection signal from the tape sensor. The determination may be made based on a driving status of the feeding rollers 18, 19 (whether the rollers are idling). As in the case described above, if it is determined for the print-receiving tube 201 or the print-receiving tape 101 that an inability to supply/a failure in feeding of the tube (tape) defined as the error event has occurred, the error monitoring control portion 40B outputs the temporary stop instruction signal to the print control portion 40A. If it is subsequently determined that the inability to supply/failure in feeding of the tube (tape) is eliminated by an operator's suitable process etc., the error monitoring control portion 40B output the production resumption instruction signal to the print control portion 40A.

(iv) Overheating of Printing Head

This is a state of the printing head 14 overheated due to accumulated heat from continuous print operations (a state requiring cooling as a cooling process). To detect this state, this embodiment includes predefined cooling start temperature and cooling end temperature (lower than the cooling start temperature) set and stored in advance as threshold values. If it is detected that the value of the temperature of the printing head 14 detected by the temperature sensor rises to the cooling start temperature, this is considered as the occurrence of the overheating of the printing head 14 defined as the error event, and the error monitoring control portion 40B outputs the temporary stop instruction signal to the print control portion 40A. If it is subsequently detected that the detected temperature decreases to the cooling end temperature due to natural cooling etc., the error monitoring control portion 40B outputs the production resumption instruction signal to the print control portion 40A.

(v) Inability to Cut or Cutting Failure

This is a state in which the tube cutter 16 (or the tape cutter 15) was not able to cut the print-receiving tube 201 (or the print-receiving tape 101) after print formation (or a cutting failure such as being stuck and stopped has occurred during the cutting operation). For example, a suitable sensor capable of detecting the start or end of the cutting operation is disposed and the determination is made by the error monitoring control portion 40B based on a detection signal from the sensor 21. The determination may be made based on a driving status of the cutter solenoids 34a, 34b. As in the case described above, if it is determined for the print-receiving tube 201 or the print-receiving tape 101 that the inability to cut or the cutting failure defined as the error event has occurred, the error monitoring control portion 40B outputs the temporary stop instruction signal to the print control portion 40A. If it is subsequently determined that the inability to cut or the cutting failure is eliminated by an operator's suitable process (such as removal of jammed paper/cleaning around the tube cutter 1 or the tape cutter 15), the error monitoring control portion 40B outputs the production resumption instruction signal to the print control portion 40A.

Returning to FIG. 6, the print control portion 40A executing step S90 as described above acts as an error storage portion described in claims. The storage of contents of the error event as described above enables the display of the message as shown in FIG. 5E described above at the time of execution of step S20 described later.

Subsequently, going to step S95, the print control portion 40A executes a power source shutoff process of shutting off a power supply path from the battery in the battery storage portion 41 with a suitable technique to automatically turn off the power source. After executing the power source shutoff process, this flow is terminated. The print control portion 40A executing step S95 acts as a switching portion described in claims. Instead of switching to the power supply shutoff state as described above, switching may be made to a predefined low power consumption state (so-called sleep state) with a suitable known technique.

After the power source is automatically turned off at step S95 as described above, the operator turns on the power source again and the flow of FIG. 6 is started again. In this case, since the flag F=1 is set at step S85 as described above, the determination of step S2 is affirmative (S2:YES) and the print control portion 40A goes to step S20.

At step S20, the print control portion 40A outputs a display control signal to the display portion 3 to display the contents of the error event stored at step S90 on the display portion 3 (see FIG. 5E). The print control portion 40A executing step S20 acts as a display control portion described in claims.

Subsequently, going to step S25, the print control portion 40A determines whether the confirmation key is operated. When the operator viewing the display of step S20 executes a proper process corresponding to the error event (the battery replacement, the natural cooling, the replenishment or the elimination of jamming of the print-receiving tube 201, the replacement of the cartridge 100, the elimination of jamming of the print-receiving tape 101) and operates the confirmation key, the determination becomes affirmative (S25:YES) and the print control portion 40A goes to step S30 described above to acquire the production number K1 again. The print control portion 40A subsequently goes through step S35 and repeats step S40 to S65 so as to execute the same print tube production process as descried above. In this case, since the value of the production number K1 is updated at step S80 described above and the updated value is acquired at step S30, the print tubes T are produced only by the number of the tubes not produced due to the power source shutoff process described above (in other words, the remainder after subtracting the number of the tubes produced before the interruption from the initial production number).

During Production of Print Label

In FIG. 7, the processes of steps S102 to S195 shown in a flow chart of the production of the print label L are made substantially equivalent to the processes of steps S2 to S95 of the production of the print tube shown in FIG. 6 by simply replacing "print-receiving tube" and "print tube" with "print-receiving tape" and "print label" and replacing the production number K1 and counter variable N1 described above with the same production number K2 and counter variable N2. Therefore, the processes will not be described in detail.

Details of Control Carried Out by Error Monitoring Control Portion

A control procedure executed by the error monitoring control portion 40B of the control circuit 40 of the printer 1 will be described with reference to FIG. 8.

First, at step S210, the error monitoring control portion 40B determines whether a value of the flag F is one. If the power source is turned off as described above at step S95 (or step S195) of FIG. 6 (or FIG. 7) described above, F=1 is set at step S85 (or step S185) immediately before the power-off and, therefore, the determination is affirmative (S210:YES) and the error monitoring control portion 40B goes to step S240 described later. If the power source is not yet turned off, the determination is negative (S210:NO) and the error monitoring control portion 40B goes to step S220.

At step S220, the error monitoring control portion 40B determines whether the error event described above has occurred, with the technique described above. While the error event is not detected, the determination of step S220 is negative (S220:NO) and the error monitoring control portion 40B waits in a loop. If the error event is detected, the determination is affirmative (S220:YES) and the error monitoring control portion 40B goes to step S230. The error monitoring control portion 40B executing step S220 acts as an error occurrence detecting portion described in claims.

At step S230, the error monitoring control portion 40B outputs the temporary stop instruction signal described above to the print control portion 40A. This output of the temporary stop instruction signal causes the print control portion 40A to interrupt the printing process as described above (see step S55 of FIG. 6 or step S155 of FIG. 7 described above). The error monitoring control portion 40B executing step S230 acts as an interruption control portion described in claims.

Subsequently, going to step S240, the error monitoring control portion 40B determines whether the detected error event is eliminated. Until the error event detected at step S220 is no longer detected because of the operator's suitable process to the error event as described above, the determination of step S240 is negative (S240:NO) and the error monitoring control portion 40B waits in a loop. If the error event is no longer detected, the determination becomes affirmative (S240:YES) and the and the error monitoring control portion 40B goes to step S250.

At step S250, the error monitoring control portion 40B outputs the production resumption instruction signal described above to the print control portion 40A. The output of the production resumption instruction signal enables the print control portion 40A to resume the printing as described above, (see step S70 of FIG. 6 or step S170 of FIG. 7 described above). Subsequently, this flow is terminated.

The present disclosure is not limited to the embodiment and may variously be modified without departing from the spirit and the technical ideas thereof. Such modification examples will hereinafter be described in order. In the modification examples, the portions equivalent to those of the embodiment are denoted by the same reference numerals and will not be described or will be described in a simplified manner as needed.

(1) Clearly Indicating Whether Print Label is Being Produced or Print Tube is Being Produced As described above, the printer 1 of this embodiment can selectively produce the print label L or the print tube T. In this regard, as shown in FIGS. 9A and 9B corresponding to FIG. 5E, the error display screen may also display which one was being produced at the time of occurrence of the error event between the print label L and the print tube T.

(2) When Error Event is Eliminated Before Power Source is Turned on Again

This is the case that when the printer 1 is powered off as described above and the operator executes a suitable process based on the presumption of contents of the error event (or blindly), the error event is eliminated. The operator accustomed to the use of the printer 1 may feel a sign of an error event before occurring or may be familiar with the error event frequently occurring in the printer 1, and therefore may execute the process before turning on the power source again to display the error display screen as described above. This modification example will hereinafter be described with reference to FIG. 10 corresponding to FIG. 6.

A flow shown in FIG. 10 has step S310 newly provided between step S2 and step S20 of the flow of FIG. 6 described above. As described above, when the power source is turned off by the auto power-off function and is then turned on again while F=1 is set, the determination of step S2 is affirmative (S2:YES) and the print control portion 40A goes to newly provided step S310. At step S310, the print control portion 40A determines whether a production resumption instruction signal is input. If the error event causing the power-off is eliminated as a result of the suitable process executed by the operator based on the presumption (or blindly) before turning on the power source as described above, the error monitoring control portion 40B goes through step S240 of FIG. 8 described above and outputs the production start instruction signal at step S250 and the signal is input to the print control portion 40A. Therefore, the determination of step S310 is affirmative and the print control portion 40A goes to newly provided step S320. The print control portion 40A executing step S310 acts as an error elimination detection portion described in claims.

At step S320, the print control portion 40A outputs a display control signal to the display portion 3 to display the contents related to the error event that had occurred as is the case with step S20 and to also display that the error event is already eliminated (not shown). Subsequently, the print control portion 40A goes to step S30 as described above and then executes the same procedure as the flow of FIG. 6.

(3) Others

After the error display screen shown in FIGS. 5E, 9A, and 9B described above is cleared due to the subsequent resumption of the printing operation (or due to the suitable operation through the operating portion 4), the error display screen shown in FIGS. 5E, 9A, and 9B described above (or a screen equivalent thereto) may be displayed again by performing a suitable operation through the operating portion 4 while a predefined menu screen is displayed on the display portion 3.

It is noted that terms "vertical," "parallel," "plane," etc. in the above description are not used in the exact meanings thereof. Specifically, these terms "vertical," "parallel," and "plane" allow tolerances and errors in design and manufacturing and have meanings of "substantially vertical," "substantially parallel," and "substantially plane."

It is noted that terms "same," "equal," "different," etc. in relation to a dimension and a size of the exterior appearance in the above description are not used in the exact meaning thereof. Specifically, these terms "same," "equal," and "different" allow tolerances and errors in design and manufacturing and have meanings of "substantially the same," "substantially equal," and "substantially different." However, when a value used as a predefined determination criterion or a delimiting value is described such as a threshold value and a reference value, the terms "same," "equal," "different," etc. used for such a description are different from the above definition and have the exact meanings.

The arrows shown in FIG. 2 indicate an example of signal flow and are not intended to limit the signal flow directions.

The flowcharts shown in FIGS. 6 to 8, 10, etc. are not intended to limit the present disclosure to the procedures shown in the flows and the procedures may be added/deleted or may be executed in different order without departing from the spirit and the technical ideas of the disclosure.

The techniques of the embodiment and the modification examples may appropriately be utilized in combination other than those described above.

Although not exemplarily illustrated one by one, the present disclosure is implemented with other various modifications without departing from the spirit thereof.

What is claimed is:

1. A printer comprising:
a plurality of operation mechanisms that includes a feeder configured to feed a print-receiving medium, a printing head configured to form a desired print on said print-receiving medium, and a display device configured to perform desired display, the plurality of operation mechanisms being configured to be operated by a supplied power source voltage;
an accepting portion configured to accept a printing instruction;
an operation control portion configured to control said plurality of operation mechanisms in accordance with said printing instruction accepted by said accepting portion so as to sequentially execute a printing process onto a predefined amount of said print-receiving medium;
an error occurrence detecting portion configured to detect occurrence of an error event related to an operation of at least one of said plurality of operation mechanisms;
an interruption control portion configured to interrupt a printing process onto said predefined amount of said print-receiving medium corresponding to said printing instruction in a case that said error occurrence detecting portion detects occurrence of said error event during said printing process;
a switching portion configured to perform switching to a supply shutoff state or a low power consumption state of said power source voltage, the switching being triggered by an elapsing of a reference amount of time after said interruption control portion interrupts said printing process;
an error storage portion configured to store contents of said error event corresponding to said interruption when said switching portion performs the switching to said supply shutoff state or said low power consumption state; and
a display control portion configured to control said display device to display, upon detecting that a return to a normal power supply state is made by a return operation after the switching by said switching portion, an error display screen specific to said error event that occurred prior to switching to the supply shutoff state or the low power consumption state and stored in said error storage portion.

2. The printer according to claim 1, wherein
in the case that the return to said normal power supply state is made by said return operation after the switching by said switching portion, said operation control portion controls said plurality of operation mechanisms to sequentially execute said printing process onto a remaining amount of said print-receiving medium acquired by subtracting a production amount of said print-receiving medium produced before said interruption from said predefined amount.

3. The printer according to claim 1, wherein
based on the control of said display control portion, said display device displays on said error display screen at least one of a time of occurrence of the error event, an amount of said print-receiving medium completed in the printing process before the occurrence of the error event, and printing contents, along with the contents of said error event.

4. The printer according to claim 1, wherein
based on the control of said display control portion, said display device displays a menu screen enabling transition to a screen displaying the contents of said error event after a display state of said error display screen is cleared.

5. The printer according to claim 1, wherein
the printer is a print label producing apparatus that has a battery storage portion configured to store a battery for supplying said power source voltage, and is configured to form a desired print with said printing head while feeding a print-receiving tape as said print-receiving medium by said feeder and to produce a print label by the print-receiving tape having the print formed thereon.

6. The printer according to claim 1, wherein:
the printer is a print label/print tube producing apparatus having a battery storage portion configured to store a battery for supplying said power source voltage, wherein the printer is configured to form a desired print with said printing head while selectively feeding a print-receiving tape or a print-receiving tube as said print-receiving medium by said feeder and to produce a print label or a print tube by the print-receiving tape or the print-receiving tube having the print formed thereon,
in the case that the return to said normal power supply state is made, said display control portion controls said display device to display on said error display screen the contents of said error event stored in said error storage portion in a distinguishable manner in terms of whether the contents are related to production of said print label or production of said print tube.

7. The printer according to claim 1, wherein
said error occurrence detecting portion detects as said error event at least one of an insufficient voltage of a battery for supplying said power source voltage, an inability to supply said print-receiving medium, a failure in feeding of said print-receiving medium, and overheating of said printing head.

8. A printer comprising:
a plurality of operation mechanisms that includes a feeder configured to feed a print-receiving medium, a printing head configured to form a desired print on said print-receiving medium, and a display device configured to perform desired display, the plurality of operation mechanisms being configured to be operated by a supplied power source voltage;
an accepting portion configured to accept a printing instruction;
an operation control portion configured to control said plurality of operation mechanisms in accordance with said printing instruction accepted by said accepting portion so as to sequentially execute a printing process onto a predefined amount of said print-receiving medium;
an error occurrence detecting portion configured to detect occurrence of an error event related to an operation of at least one of said plurality of operation mechanisms;
an interruption control portion configured to interrupt a printing process onto said predefined amount of said print-receiving medium corresponding to said printing instruction in the case that said error occurrence detecting portion detects occurrence of said error event during said printing process;
a switching portion configured to perform switching to a supply shutoff state or a low power consumption state of said power source voltage, the switching being triggered by an elapsing of a reference amount of time after said interruption control portion interrupts said printing process;

an error storage portion configured to store contents of said error event corresponding to said interruption when said switching portion performs the switching to said supply shutoff state or said low power consumption state;

a display control portion configured to control said display device to display an error display screen representative of the contents of said error event stored in said error storage portion in the case that a return to a normal power supply state is made by a return operation after the switching by said switching portion; and an error elimination detection portion configured to detect elimination of said error event corresponding to the interruption during said supply shutoff state or said low power consumption state after the switching by said switching portion, wherein, in the case that the return to said normal power supply state is made after said error elimination detection portion detects the elimination of said error event, said display control portion controls said display device to display the elimination of the error event along with the contents of said error event on said error display screen.

* * * * *